United States Patent
Wang

(10) Patent No.: US 8,060,548 B2
(45) Date of Patent: Nov. 15, 2011

(54) MESSAGING METHOD

(75) Inventor: Jimmy Xiaoji Wang, Edinburgh (AU)

(73) Assignee: The Commonwealth of Australia (AU)

( * ) Notice: Subject to any disclaimer, the term of this patent is extended or adjusted under 35 U.S.C. 154(b) by 998 days.

(21) Appl. No.: 11/916,265

(22) PCT Filed: Jun. 5, 2006

(86) PCT No.: PCT/AU2006/000760
§ 371 (c)(1),
(2), (4) Date: Nov. 30, 2007

(87) PCT Pub. No.: WO2006/128252
PCT Pub. Date: Dec. 7, 2006

(65) Prior Publication Data
US 2008/0215657 A1    Sep. 4, 2008

(30) Foreign Application Priority Data

Jun. 3, 2005    (AU) ................................ 2005902871

(51) Int. Cl.
*G06F 7/38* (2006.01)
(52) U.S. Cl. ...................................... 708/441; 708/200
(58) Field of Classification Search .................. 708/441, 708/200
See application file for complete search history.

(56) References Cited

U.S. PATENT DOCUMENTS

| | | | | |
|---|---|---|---|---|
| 6,101,280 A | * | 8/2000 | Reynolds | 382/241 |
| 6,295,546 B1 | * | 9/2001 | Adiletta | 708/402 |
| 6,360,019 B1 | * | 3/2002 | Chaddha | 382/253 |
| 6,404,923 B1 | * | 6/2002 | Chaddha | 382/224 |
| 6,525,722 B1 | * | 2/2003 | Deering | 345/419 |
| 6,606,095 B1 | * | 8/2003 | Lengyel et al. | 345/473 |
| 6,735,253 B1 | * | 5/2004 | Chang et al. | 375/240.16 |
| 7,082,164 B2 | * | 7/2006 | Chaddha | 375/240.12 |
| 7,193,542 B2 | | 3/2007 | Jegou et al. | |
| 7,194,128 B1 | * | 3/2007 | Payton | 382/166 |
| 7,319,796 B1 | * | 1/2008 | Sharp et al. | 382/248 |
| 7,342,580 B1 | * | 3/2008 | Peterson | 345/418 |

(Continued)

FOREIGN PATENT DOCUMENTS

CA    1 128 624    7/2008

(Continued)

OTHER PUBLICATIONS

International Search Report for corresponding PCT Application No. PCT/AU2006/000760 (Filing Date: Jun. 5, 2006), mailed on Jul. 25, 2006.

(Continued)

*Primary Examiner* — Lewis Bullock, Jr.
*Assistant Examiner* — Michael Yaary
(74) *Attorney, Agent, or Firm* — Knobbe, Martens, Olson & Bear LLP

(57)    ABSTRACT

This invention relates to a short message format that captures useful information embedded in a data vector of sequence of symbols or numbers. The data vector may represent many different forms of information generated by various electronic and information systems. This short message format is particularly useful when bandwidth limited communication links are used to transmit a data set that can be represented as a set of data vectors that is true for essentially all types of data. Described herein is an algorithm formulated to be useful for data communication problems associated with bandwidth limited communication links.

15 Claims, 1 Drawing Sheet

U.S. PATENT DOCUMENTS

2004/0233197 A1* 11/2004 Liu et al. ................. 345/442
2005/0207664 A1*  9/2005 Ramasastry et al. ......... 382/240

FOREIGN PATENT DOCUMENTS

| | | |
|---|---|---|
| EP | 0 273 820 A2 | 7/1988 |
| FR | 2842671 A1 | 1/2004 |
| JP | 07-111458 A | 4/1995 |
| JP | 09-190592 A | 7/1997 |
| WO | WO 03/096543 A1 | 11/2003 |

OTHER PUBLICATIONS

Supplementary European Search Report dated Mar. 6, 2009 for related Application No. EP 06 74 1177.

Michael O. Kolawole. "Radar Systems, Peak Detection and Tracking" (online), ISBN: 9780750657730. http://books.google.com/books?id=aUKmrBz8V4gC&printsec=frontcover&output=html. pp. 216-217 (2002).

* cited by examiner

MESSAGING METHOD

This invention relates to a short message format that captures useful information embedded in a data vector of a sequence of symbols or numbers. The data vector may represent many different forms of information generated by various electronic and information systems. This short message format is particularly useful when bandwidth limited communication links are used to transmit a data set that can be represented as a set of data vectors that is true for essentially all types of data.

Described herein is an algorithm formulated to be useful for data communications problems associated with bandwidth limited communications links.

BACKGROUND OF THE INVENTION

Low data communication bandwidths exist for one or more reasons for many communications systems and the data to be transmitted can thus take inordinate periods of time to transmit because of the low data rate achievable on the channel. Even when communication channels of adequate bandwidth are available, the priority of the data may be such that it is not of adequate benefit to devote that available bandwidth to the task of communicating the data to where it may be of greatest value.

This highlights the importance of data reduction algorithms for the transmission of data generated by various electronic and information systems.

BRIEF DESCRIPTION OF THE INVENTION

In this specification a potential solution to this problem is described that uses a sequence of short messages to transmit a data set that can be divided into a number of data vectors. Each short message captures the essential information embedded in a data vector. A reconstructed data set can then be formed after a number of short messages have been received. The reconstructed data set contains the essential information embedded in the original data set.

According to a first aspect of the present invention, there is provided a method for creating a short message for the transmission of information embedded in a data vector, the data vector consisting of data points wherein each point has a value and a position, and the short message having the form $$M=[V_1,V_2,\ldots,V_N,P_1,P_2,\ldots,P_N,BG,\text{Var}],$$

where $V_1, V_2, \ldots, V_N$ are the values of N peaks, $P_1, P_2, \ldots, P_N$, are their corresponding positions in the data vector, BG and Var are indications of the background level and variability of the data points values contained in the data vector, the method includes the following steps:
  a) determining the maximum number of peaks N to be included in the short message M and a minimum position separation for the peaks in the short message;
  b) selecting the largest peak in said data vector, and adding the value and corresponding position of the selected peak to the short message M,
  c) selecting the next largest peak if its position is greater than the minimum position separation from each of said previously selected peaks, then adding the value and position of the selected next largest peak to the short message M,
  d) repeating step c) until the said maximum number of peaks N have been selected or the list of peaks in said data vector in descending order has been exhausted.

In a further aspect of the invention the indication of background level BG is the mean $\mu$ of the data points contained in the data vector, and the variability Var is the standard deviation $\sigma$ of the data points contained in the data vector. An alternative mean and standard deviation of the background may be calculated by the further step of removal of data points in the data vector around said positions of the peaks in M, and calculating the mean and standard deviation on the data points remaining in the data vector.

In yet a further aspect of the invention the $P_1, P_2, \ldots, P_N$ are a time point associated with each of the N peaks, and BG and Var are the background level and variability of the data vector representing the signal. The background level BG and the variability Var may be the mean $\mu$ and the standard deviation $\sigma$ of the data vector representing the signal.

In yet a further aspect of the invention the method further includes the steps of:
fitting an exponential distribution defined as:

$$h(x) = \frac{1}{\alpha}\exp\left(-\frac{x}{\alpha}\right),$$

to the data vector and finding the parameter $\alpha$ in a maximum likelihood sense; and including the parameter $\alpha$ in the short message M.

In yet a further aspect of the invention the may include the following step to be performed before step b):
  finding all the peaks in said data vector and sorting the peak values in descending order to form a peak vector A,
  and wherein step b) is performed by selecting the first peak in the peak vector A and adding the value and corresponding position of the selected first peak to the short message M, and wherein steps c) and d) are performed by repeatedly selecting the next peak in the peak vector A and testing if its position is not within the determined minimum position separation from each of the previously selected peaks, and adding the value and corresponding position of the selected peak to the message M until either N peaks have been selected or the list of peaks in the peak vector A has been exhausted.

According to a second aspect of the present invention there is provided a method of reconstructing a plurality of successive short messages into a matrix wherein each short message has the form $$M=[V_1,V_2,\ldots,V_N,P_1,P_2,\ldots,P_N,BG,\text{Var}],$$

where $V_1, V_2, \ldots, V_N$ are the values of N peaks, $P_1, P_2, \ldots, P_N$, are their corresponding positions, BG and Var are the background level and variability of the data points contained in the data vectors of the original data set, the method comprising the step:
  forming a matrix with the number of rows being the number of successive short messages received and the number of columns being at least the number of positions in the plurality of successive short messages, wherein each row, the entries whose columns correspond to peaks in the short message are the peak values thereof, while all of the other entries in each row are each set to an appropriate value and wherein the matrix contains the value tracks in the data set with all the selected peak values of the original data set.

In a further aspect of the invention each appropriate value for the other entries in a row is based upon one or both of the background level BG and variability Var in the short message associated with the row. In yet a further aspect of the invention the appropriate value for all other entries in each row is b=min {4(m−n), 4 n/5}, where m and n are, respectively, the maximum and minimum values of the peaks from all the short messages forming the matrix.

According to a third aspect of the present invention there is provided a method of determining peaks of interest in a received short message containing information embedded in a data vector, and the short message having the form $$M=[V_1,V_2,\ldots,V_N,P_1,P_2,\ldots,P_N,\mu,\sigma],$$

where $V_1, V_2, \ldots, V_N$ are the values of N peaks, $P_1, P_2, \ldots, P_N$, are their corresponding positions, $\mu$ and $\sigma$ are the mean and standard deviation of the data contained in the data vector, the method including the step of performing a statistical analysis to determine the significance of the peaks contained in the data vector wherein the probability density function of a normal distribution with mean $\mu$ and standard deviation $\sigma$ is defined as $$g(x) = \frac{1}{\sigma\sqrt{2\pi}}\exp\left(-\frac{(x-\mu)^2}{2\sigma^2}\right) \quad (1)$$

and wherein $f(x)$ is the probability density function of the normal distribution (1), then the cumulative probability at p is defined as $$P(X\leq p)=\int_{-\infty}^{p}f(x)dx, \quad (3)$$

which is the probability of a random variable X with the probability distribution defined by the density function $f(x)$ being less than or equal to p and for a predetermined p, the cumulative probability characterises the significance of the value p for each peak N.

In a further aspect of the invention the short message has the form $$M=[V_1,V_2,\ldots,V_N,P_1,P_2,\ldots,P_N,\mu,\sigma,\alpha],$$

where $\mu$ and $\sigma$ are the mean and standard deviation of the data contained in the data vector $\alpha$ is representative of an exponential model fitted to the data, and the step of performing a statistical analysis to determine the significance of the peaks contained in the data vector further comprises assessing the significance against an exponential distribution, wherein the probability density function of an exponential distribution with parameter $\alpha$ is defined as $$h(x) = \frac{1}{\alpha}\exp\left(-\frac{x}{\alpha}\right) \quad (2)$$

and wherein $f(x)$ is the probability density function of the exponential distribution (2), then the cumulative probability at p is defined as $$P(X\leq p)=\int_{-\infty}^{p}f(x)dx, \quad (3)$$

which is the probability of a random variable X with the probability distribution defined by the density function $f(x)$ being less than or equal to p and for a predetermined p, the cumulative probability characterises the significance of the value p for each peak N.

According to a fourth aspect of the present invention there is provided a method of determining peaks of interest in a received short message containing information embedded in a data vector, and the short message having the form $$M=[V_1,V_2,\ldots,V_N,P_1,P_2,\ldots,P_N,\alpha],$$

where $V_1, V_2, \ldots, V_N$ are the values of N peaks, $P_1, P_2, \ldots, P_N$, are their corresponding positions, $\alpha$ is representative of an exponential model fitted to the data, the method including the step of performing a statistical analysis to determine the significance of the peaks contained in the data vector wherein the probability density function of an exponential distribution with parameter $\alpha$ is defined as $$h(x) = \frac{1}{\alpha}\exp\left(-\frac{x}{\alpha}\right) \quad (2)$$

and wherein $f(x)$ is the probability density function of the exponential distribution (2), then the cumulative probability at p is defined as $$P(X\leq p)=\int_{-\infty}^{p}f(x)dx, \quad (3)$$

which is the probability of a random variable X with the probability distribution defined by the density function $f(x)$ being less than or equal to p and for a predetermined p, the cumulative probability characterises the significance of the value p for each peak N.

In a further aspect, a computer readable medium may be provided, containing instructions for implementing any one of the methods described herein.

A specific embodiment of the invention will now be described in some further detail with reference to and as illustrated in the accompanying figures. This embodiment is illustrative of an underwater sensor and communication environment in which the application of the invention is described but it should not restrict the scope of the invention to this application in other environments or applications. Suggestions and descriptions of other embodiments may be included within the scope of the invention but they may not be illustrated in the accompanying figures or alternatively features of the invention may be shown in the figures but not described in the specification.

DETAILED DESCRIPTION OF AN EMBODIMENT OF THE INVENTION

Figure 1:
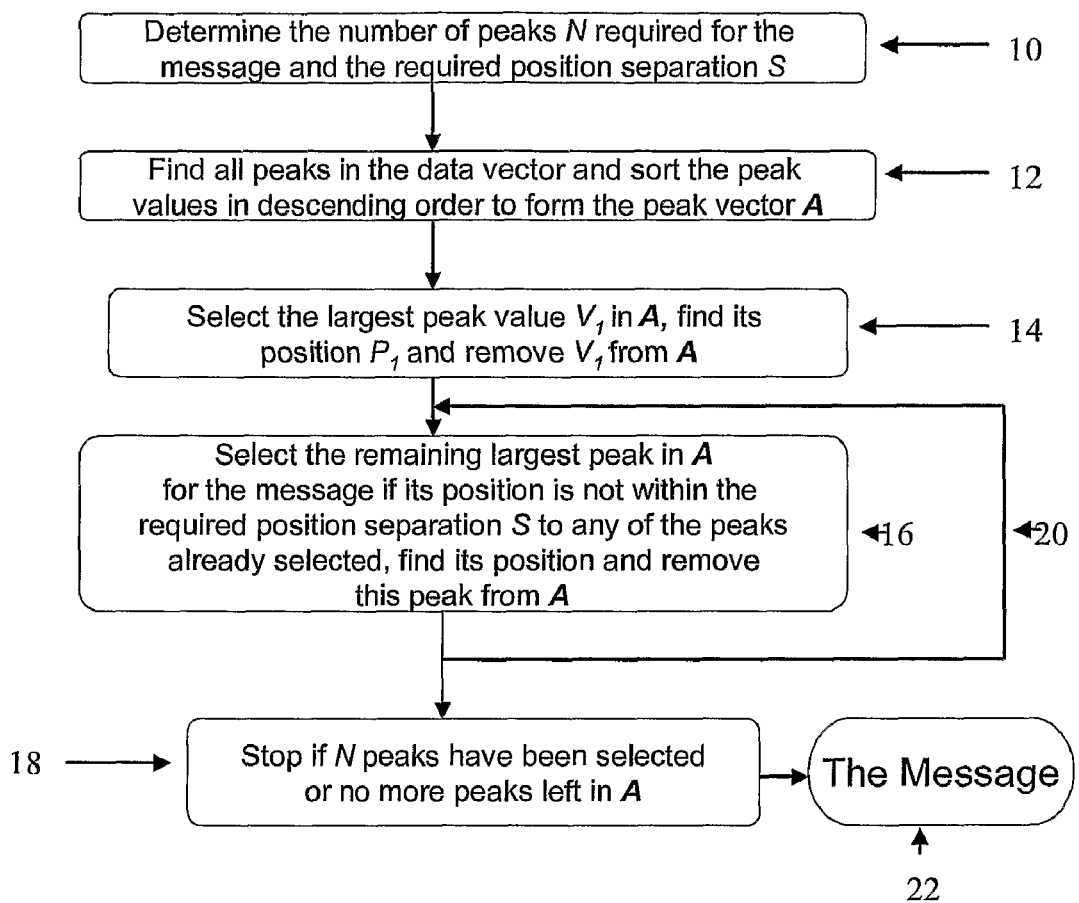
FIG. 1 depicts an embodiment of the flow diagram of the method of the invention.

A purposely-designed short message format can be used to transmit a set of data. Each message summarises the information embedded in a data vector in a compact format that is suitable for applications using bandwidth limited communication links. A sequence of such short messages can be used to reconstruct the data set with the relative values preserved. This short message format can be used in conjunction with other data communications algorithms such as those utilising image compression and reconstruction algorithms, which are the subject of a separate patent application, International Application No. PCT/AU2006/000759 in the name of the same applicant, entitled "Matrix Compression Arrangements" and filed on Jun. 5, 2006, which published as International Publication No. WO 2006/128251, on Dec. 7, 2006, and which is incorporated herein by reference.

This specification provides a design of a very short message that summaries the information provided by a data vector and is so short that it can be used for applications utilising severely bandwidth limited communication links.

For any data vector, the short message takes the form $$M=[V_1,V_2,\ldots,V_N,P_1,P_2,\ldots,P_N,\mu,\sigma],$$

where $V_1, V_2, \ldots, V_N$ are the values of N peaks, $P_1, P_2, \ldots, P_N$ are their corresponding positions, μ and σ are the mean and standard deviation of the data points contained in the data vector. The mean μ is an indication of the background level and the standard deviation σ is an indication of the background variability.

If there are values of interest present in the data vector, more accurate mean and standard deviation of the background may be calculated with the removal of the data points around the positions of the values of interest.

When selecting the N peaks, a minimum position separation should be predetermined so as to avoid two peaks coming from related data points, which may represent the same source represented by the data points or a common signal source if the data is representative of signals, being chosen.

The value of N will depend to some degree on the wanted or needed size of the short message and this may be determined by a number of factors that include the capacity of the communication channel that is available at the time and/or the number of peaks of interest that are required to be communicated in the short message format. The later requirement may sometimes depend on a variable that could change in a short time and be chosen by a processor or which may be determined by a human operator who is capable of determining the peaks of interest.

Referring to FIG. 1, the procedure, at a minimum, includes the following steps: selecting the largest peak (14), selecting the next largest peak if it passes the position separation test for each of the previously selected peaks (16), otherwise, go to the next one (20), and so on. Stop if N peaks have been selected or the list of peaks in descending order has been exhausted (18). Thus, the message (22) contains at most N peaks. The process is illustrated in the flow chart at FIG. 1.

The step of determining the number of peaks N and the required position separation S (10) is a preliminary step that as described can be determined on an as needs basis or may be predetermined.

The step of determining all the peaks in the data vector and sorting the value of those peaks in descending order to form a peak vector A (12) is also a preliminary step of data preparation.

The data vector can represent any data and may in one example represent a signal received at a remote sensor having a variety of characteristic including for example a voltage, current, etc. which fluctuate over time and thus have one or more peaks of which none, one or more may be of particular interest.

After receiving a short message of the form described above, the end user may first assess how much some of the peaks are above the background level with consideration being given to the background variability as well. A large difference in either and both indicates that a value of interest is present which warrants further investigation.

The end user may also perform a statistical analysis to quantify the significance of the peaks compared to the data contained in the data vector after assuming a commonly used statistical model for the data. Normal and exponential distributions may be the ones most suitable for modelling the signal data contained in the data vector. The probability density function of a normal distribution with mean μ and standard deviation σ is defined as $$g(x) = \frac{1}{\sigma\sqrt{2\pi}} \exp\left(-\frac{(x-\mu)^2}{2\sigma^2}\right) \quad (1)$$

and that for an exponential distribution is $$h(x) = \frac{1}{\alpha} \exp\left(-\frac{x}{\alpha}\right). \quad (2)$$

If f(x) is the probability density function of a probability distribution, then the cumulative probability at p is defined as $$P(X \leq p) = \int_{-\infty}^{p} f(x) dx, \quad (3)$$

which is the probability of a random variable X with the probability distribution defined by the density function f(x) being less than or equal to p. Thus, for a given p, this cumulative probability characterises how significant the value p is.

Assuming that values of the data vector fit a normal distribution, then it is possible to fit the model to the values to find μ and σ, which are the maximum likelihood estimation of the mean and standard deviation for the given data. Having calculated the probability density function using equation (1), it is possible to evaluate the cumulative probability at each of the N values utilising equation (3). These cumulative probabilities indicate how significant the values are and provide guidance to an end user as to whether a value of interest might be present.

Assuming that the values of the data vector fit an exponential distribution, it is possible to fit the model to find α in maximum likelihood sense. The end user needs this number α to perform the statistical analysis, so it is needed in the short message $$M = [V_1, V_2, \ldots, V_N, P_1, P_2, \ldots, P_N, \mu, \sigma, \alpha].$$

Then, it is possible to evaluate the cumulative probability for each of the N peaks similarly to the normal distribution case.

The short message formed in this way is so short that it can be transmitted to an end user quickly even via a bandwidth limited communication channels. The end user can examine the peak values taking into account of the mean and variance, which represent the background level and its variability. A statistical analysis to quantify the level of significance of the peaks may also be conducted.

With a number of successive short messages, it is possible to form a matrix with the number of rows being the number of short messages received and the number of columns being the number of positions. In each row, the entries whose columns correspond to peaks in the short message are the peak values, while all other entries are set to an appropriate value as described below and will be called the background value.

Let m and n be the maximum and minimum values respectively from all the short messages. One way to set the background value is b=min{4(m−n), 4 n/5}. It is then possible to display this matrix as an image, which can be referred to as a reconstructed data set. Value tracks can be visualised in this way with the peak values preserved.

It will be appreciated, by those skilled in the art that the invention is not restricted in its use to the particular applications described. Neither is the present invention restricted in its preferred embodiment with regard to the particular elements and/or features described or depicted herein. It will be appreciated that various modifications can be made without The claims defining the invention are as follows:

1. A method for creating a short message for the transmission of information embedded in a data vector, the data vector consisting of data points wherein each point has a value and a position, and the short message having the form $$M=[V_1,V_2,\ldots,V_N,P_1,P_2,\ldots,P_N,BG,\text{Var}],$$

where $V_1, V_2, \ldots, V_N$ are values of N peaks, $P_1, P_2, \ldots, P_N$, are their corresponding positions in the data vector, BG and Var are indications of background level and variability of the data point values contained in the data vector, the method includes the following steps:
   a) determining a maximum number of peaks N to be included in the short message M, a minimum position separation for the peaks in the short message, and indications of the background level and variability of the data point values contained in the data vector;
   b) selecting a largest peak in said data vector, and adding the value and corresponding position of the selected peak to the short message M;
   c) selecting a next largest peak if its position is greater than the minimum position separation from each of said previously selected peaks, then adding the value and position of the selected next largest peak the short message M;
   d) repeating step c) until the said maximum number of peaks N has been selected or the list of peaks in said data vector in descending order has been exhausted; and e) transmitting the short message.

2. The method of claim 1, wherein the indication of background level BG is a mean µ of the data points contained in the data vector, and the indication of variability Var is a standard deviation σ of the data points contained in the data vector.

3. The method of claim 1, wherein $V_1, V_2, \ldots, V_N$ are values of N peaks of a signal, and $P_1, P_2, \ldots, P_N$, are time points associated with each of the N peaks, and BG and Var are a background level and a variability of the data vector representing the signal.

4. The method of claim 2, wherein the mean and standard deviation are calculated by the further step of:
   e) removal of data points in the data vector around said positions of the peaks in M, and calculating a mean and standard deviation of the data points remaining in the data vector.

5. The method of claim 3, wherein the background level BG and the variability Var are a mean µ and a standard deviation σ of the data vector representing the signal.

6. The method of claim 1, further including the steps of:
   determining a parameter α such that the data vector fits an exponential distribution defined by the parameter α in a maximum likelihood sense; and
   including the parameter α with the short message M.

7. The method of claim 1, further including:
   finding all peaks in said data vector and sorting the peak values in descending order to form a peak vector A before step b), and wherein
   step b) is performed by selecting a first peak in the peak vector A and adding the value and corresponding position of the selected first peak to the short message M, and wherein
   steps c) and d) are performed by repeatedly selecting a next peak in the peak vector A and testing if its position is not within the determined minimum position separation from each of the previously selected peaks, and adding the value and corresponding position of the selected peak to the message M until either N peaks have been selected or the list of peaks in the peak vector A has been exhausted.

8. A non transitory computer readable medium containing instructions stored thereon, said instructions for implementing a method for creating a short message for the transmission of information embedded in a data vector, the data vector consisting of data points wherein each point has a value and a position, and the short message having the form $$M=[V_1,V_2,\ldots,V_N,P_1,P_2,\ldots,P_N,BG,\text{Var}],$$

where $V_1, V_2, \ldots, V_N$ are values of N peaks, $P_1, P_2, \ldots, P_N$, are their corresponding positions in the data vector, BG and Var are indications of a background level and variability of the data point values contained in the data vector, the method includes the following steps:
   a) determining a maximum number of peaks N to be included in the short message M, a minimum position separation for the peaks in the short message, and indications of a background level and variability of the data point values contained in the data vector;
   b) selecting a largest peak in said data vector, and adding the value and corresponding position of the selected peak to the short message M;
   c) selecting a next largest peak if its position is greater than the minimum position separation from each of said previously selected peaks, then adding the value and position of the selected next largest peak to the short message M;
   d) repeating step c) until the said maximum number of peaks N has been selected or the list of peaks in said data vector in descending order has been exhausted.

9. The non transitory computer readable medium of claim 8, wherein the indication of background level BG is a mean µ of the data points contained in the data vector, and the indication of variability Var is a standard deviation σ of the data points contained in the data vector.

10. The non transitory computer readable medium of claim 9, wherein the mean and standard deviation are calculated by the further step of:
   e) removal of data points in the data vector around said positions of the peaks in M, and calculating a mean and standard deviation of the data points remaining in the data vector.

11. The non transitory computer readable medium of claim 8, wherein $V_1, V_2, \ldots, V_N$ are values of N peaks of a signal, and $P_1, P_2, \ldots, P_N$ are time points associated with each of the N peaks, and BG and Var are a background level and a variability of the data vector representing the signal.

12. The non transitory computer readable medium of claim 11, wherein the background level BG and the variability Var are a mean µ and a standard deviation σ of the data vector representing the signal.

13. The non transitory computer readable medium of claim 8, further including the steps of:
   determining a parameter α such that the data vector fits an exponential distribution defined by the parameter α in a maximum likelihood sense, and
   including the parameter α in with the short message M.

14. The non transitory computer readable medium of claim 8, further including:
   finding all peaks in said data vector and sorting the peak values in descending order to form a peak vector A before step b), and wherein step b) is performed by selecting a first peak in the peak vector A and adding the value and corresponding position of the selected first peak to the short message M, and wherein steps c) and d) are performed by repeatedly selecting a next peak in the peak vector A and testing if its position is not within the determined minimum position separation from each of the previously selected peaks, and adding the value and corresponding position of the selected peak to the message M until either N peaks have been selected or the list of peaks in the peak vector A has been exhausted.

15. The non transitory computer readable medium of claim 8, further comprising transmitting the short message.

* * * * *